(12) United States Patent
Tappel et al.

(10) Patent No.: US 8,354,587 B2
(45) Date of Patent: Jan. 15, 2013

(54) HERMETICALLY SEALED HOUSING WITH ELECTRICAL FEED-IN

(75) Inventors: Hendrik Gezinus Tappel, Casteren (NL); Cornelis Sander Kooijman, Eindhoven (NL)

(73) Assignee: FEI Company, Hillsboro, OR (US)

( * ) Notice: Subject to any disclaimer, the term of this patent is extended or adjusted under 35 U.S.C. 154(b) by 895 days.

(21) Appl. No.: 12/091,726

(22) PCT Filed: Oct. 27, 2006

(86) PCT No.: PCT/US2006/041976
§ 371 (c)(1),
(2), (4) Date: Aug. 28, 2008

(87) PCT Pub. No.: WO2007/053442
PCT Pub. Date: May 10, 2007

(65) Prior Publication Data
US 2009/0200489 A1    Aug. 13, 2009

(30) Foreign Application Priority Data

Oct. 28, 2005 (NL) .................................... 1030295

(51) Int. Cl.
*H05K 5/06* (2006.01)
(52) U.S. Cl. ...... 174/50.5; 174/50; 174/520; 174/50.52; 439/535; 361/752; 361/748
(58) Field of Classification Search .............. 174/50, 174/50.5, 50.51, 50.52, 50.59, 520, 535, 174/367, 358; 439/535, 76.1, 76.2, 949; 361/600, 601, 679.01, 679.02, 752, 748, 361/749; 250/492.3
See application file for complete search history.

(56) References Cited

U.S. PATENT DOCUMENTS

| | | | |
|---|---|---|---|
| 4,226,491 A * | 10/1980 | Kazama et al. | 439/76.1 |
| 4,739,453 A | 4/1988 | Kurokawa et al. | |
| 4,831,498 A | 5/1989 | Baba et al. | |
| 5,103,102 A | 4/1992 | Economou et al. | |
| 5,412,211 A | 5/1995 | Knowles | |
| 5,504,659 A | 4/1996 | Acatay et al. | |
| 6,037,846 A * | 3/2000 | Oberhammer | 174/367 |
| 6,104,618 A | 8/2000 | Loibl | |

(Continued)

FOREIGN PATENT DOCUMENTS

EP    0729294    8/1996
(Continued)

OTHER PUBLICATIONS

Japanese Office Action, mail date Jan. 24, 2012, 7 pages.

*Primary Examiner* — Angel R Estrada
(74) *Attorney, Agent, or Firm* — Scheinberg & Associates, PC; Michael O. Scheinberg

(57) ABSTRACT

The invention relates to a hermetically sealed housing with an electrical feed-in. A standard printed circuit board 120 seals against housing 100. The sealing is carried out on a flat side of printed circuit board 120. The printed circuit board contains electrically conducting tracks (130, 132, 134, 136) which make the electrical connection. By making the electrical connection so that at least part of it lies parallel with the surface of the printed circuit board, no gas can leak through the printed circuit board along the conductor. The inside of the hermetically sealed space 102 may be a gas-filled space, but may also be a vacuum space, for example.

20 Claims, 1 Drawing Sheet

U.S. PATENT DOCUMENTS

| | | | |
|---|---|---|---|
| 6,305,975 B1 | 10/2001 | Steiner et al. | |
| 6,740,814 B2 * | 5/2004 | Ohta et al. | 174/50 |
| 6,816,381 B2 * | 11/2004 | Takeuchi | 174/50 |
| 7,358,438 B2 * | 4/2008 | Zoller | 174/50 |
| 7,474,604 B2 | 1/2009 | Tsukuda et al. | |
| 7,561,435 B2 * | 7/2009 | Kamoshida et al. | 174/50.5 |

FOREIGN PATENT DOCUMENTS

| | | |
|---|---|---|
| GB | 1053400 | 12/1966 |
| JP | 11243285 | 9/1999 |
| JP | 2003-283174 | 10/2003 |
| WO | WO03053745 | 7/2003 |

* cited by examiner

HERMETICALLY SEALED HOUSING WITH ELECTRICAL FEED-IN

The invention relates to a hermetically sealed housing constructed with an electrical feed-in, which housing is provided with a feed-in element insulated relative to the housing and comprises a printed circuit board which in turn comprises at least one electrical conductor and is hermetically sealed against the feed-in.

Such a housing is disclosed in U.S. Pat. No. 6,305,975.

Such a housing is used, for example, in analysis equipment which has a vacuum space surrounded by the housing, and where electrical connections have to be fed through the wall of the housing.

The aforementioned US patent specification describes an electrical feed-in installed in the wall of a housing, the vacuum vessel. The electrical feed-in consists of an electrically insulating body, made of cast epoxy, for example. The insulating body takes the form of two parts of a cylinder lying one against the other, wherein the two cylinder axes coincide and wherein the diameter of one of the cylinders differs from that of the other cylinder. The transition from one cylinder diameter to the other cylinder diameter may be an abrupt transition, but it may also be a gradual transition. A corresponding hole with slightly larger diameters is made in the wall of the housing, which hole thereby forms a connection between the inner, evacuated part of the housing and the outside.

An O-ring surrounds the insulating body at the point where the diameter varies, the outside diameter of the O-ring being smaller than the maximum diameter of the insulating body.

By inserting the insulating body with the O-ring in the hole, the O-ring will be clamped between the insulating body and the wall and the required vacuum seal provided.

The electrical connections consist of conductor tracks which form part of a printed circuit board. This printed circuit board, which is designed as a flexible printed circuit board in the aforementioned patent specification, is cast into the epoxy of the insulating body and projects from the end located on the vacuum side of the feed-in. The conductors terminate on the other side of the in-feed on a connector assembly comprising a connector.

The disadvantage of the feed-in of prior art is that the creation of the feed-in is a relatively difficult process. During the moulding of the insulating body, care must be taken to ensure that the epoxy does not adhere to the mould. The epoxy takes a long time to harden, during which shrinkage may occur. It must also be ensured that there are no air bubbles in the epoxy that can drain into the vacuum via very small ducts. The feed-in of prior art does not therefore lend itself to mass production.

The object of the invention is to provide a simpler hermetically sealed housing with an electrical feed-in.

For this purpose the housing according to the invention is characterised in that the lead-in element consists of a standard printed circuit board and the sealing between the printed circuit board and housing is carried out on a flat side of the printed circuit board.

The invention is based on the concept that the flat lower and upper sides of a printed circuit board are sufficiently smooth to produce a hermetically tight seal. Moreover, the printed circuit board is leak-tight so that there is no leakage from the board. However, the lateral edge of a printed circuit board generally forms an irregular surface, with sharp corners and projecting parts because printed circuit boards are produced from glass fibre fabrics, and glass fibres reach the surface of the lateral edge when the printed circuit board is sawn to measure from a larger board. This gives rise to a rough surface on which a good seal can only made by injection moulding techniques (e.g. epoxy). By preventing the sealing from being carried out on the lateral edge of the printed circuit board, a hermetic seal is produced. This is achieved by only having the housing sealed on the flat lower and/or upper side of the printed circuit board.

An advantage of a hermetically sealed housing in which the feed-in takes the form of a standard printed circuit board is that the simple form lends itself to mass production.

An additional advantage is that such a standard printed circuit board can easily be obtained from a number of suppliers, and that the prices are very low compared to the prices of specialty hermetically tight feed-ins.

A further additional advantage is that it is possible, for example, to mount electronic components and circuits on the printed circuit board, enabling further parts to be integrated. This generally results in a more compact, cheaper product.

It should be noted that the printed circuit board can be clamped by means of an auxiliary body against the housing section on the side of the printed circuit board that does not touch the housing section.

It should also be noted that the envelope according to the invention is useful, for example, for use in spaces where there is a risk of explosion, such as grain silos or areas in the chemical industry, where no sparks or other sources of ignition may be present. By installing switches or relays, for example, in the hermetically sealed space, any spark generated by these switches or relays does not present a risk of explosion. These switches or relays may, together with other parts, be easily soldered on the printed circuit board, resulting in a compact, simple product.

In a further embodiment of the housing according to the invention, at least a section of the electrical conductor runs parallel with the flat sides of the printed circuit board. A printed circuit board is often provided with so-called 'through-holes', i.e. holes made through the printed circuit board. These 'through-holes' can be filled by means of solder, but due to the possibility of failure, and in the interests of reliability, it is preferred not to have 'through-holes' between the hermetically sealed space and the surrounding area. However, in order to make an electrical connection between the hermetically sealed space and the surrounding area, part of the electrical conductor runs parallel with the flat sides of the printed circuit board.

In another embodiment of the housing according to the invention, the printed circuit board has an uninterrupted metallisation coat where it touches the housing.

By having the sealing carried out on an uninterrupted metallisation coat (gold-plated copper, for example), a seal will be obtained on a surface with very small surface irregularities. Even if there is still a layer of varnish on the printed circuit board between the uninterrupted metallisation coat and the housing section, the surface irregularities are smaller than if the metallisation coat were not present In a further embodiment of the housing according to the invention, the printed circuit board seals against the housing by means of elastomers.

The use of elastomers such as rubber O-rings is a well known method used in vacuum technology. By greasing these O-rings, the effect of leakage via small scratches can also be absorbed on the surfaces against which the O-ring seals. An additional advantage of the use of elastomers is that they are easily able to absorb variations in the contact pressure, for example. This may be caused, for example, by differences in expansion between the printed circuit board and metals, for example.

In yet another embodiment of the housing according to the invention, the seal is a detachable seal.

A detachable seal offers advantages, for example, when a repair or maintenance has to be carried out on parts which are located in the hermetically sealed space. As the person skilled in the art knows, such a detachable seal can be achieved, for example, by making use of O-rings.

In another embodiment of the housing according to the invention, the printed circuit board is sealed on the housing by means of an elastic adhesive.

In these cases in which the seal need not be detachable, an adhesive such as silicone adhesive may be used to seal the printed circuit board on the housing.

In a further embodiment of the housing according to the invention, the seal of the printed circuit board on the housing is a metal-to-metal seal.

As the person skilled in the area of vacuum seals is aware, metal-to-metal seals, such as steel-to-copper or iron-to-gold seals, are known for their leak-tightness.

In yet another embodiment of the housing according to the invention, the sealing of the printed circuit board on the housing is metal-to-plastic.

The advantage of a metal-to-plastic seal is that the metal is able to deform the plastic so that irregularities (both arches and scratches) on the sealing surfaces do not have adverse effects on the intake.

It should be noted that the plastic may be both the material of the housing and the material of the printed circuit board.

In yet another embodiment of the housing according to the invention, the enclosed space is a space with a low dust content.

An important industrial application is that in which electrical conductors have to be fed through the wall of a hermetically sealed space with a low dust content. This may include, for example, hard disk drives (HDD's) where the electrical signals for the read and/or write heads and the electrical signals for the motors have to be transmitted.

In another embodiment of the housing according to the invention, the enclosed space is a space with reduced pressure.

Vacuum spaces or at least spaces with a greatly reduced pressure are used, for example, in equipment in which charged particles are used. Consideration may be given here to the analysis equipment as described in the known patent specification, but also electron microscopes, for example, where a sample is irradiated with an electron beam, or so-called Focused Ion Beam machines, in which a sample is irradiated with a focused ion beam.

In a further embodiment of the housing according to the invention, the housing consists of two parts between which the printed circuit board is clamped.

In this embodiment there are two seals on the printed circuit board: the $1^{st}$ seal of the $1^{st}$ part of the housing on a $1^{st}$ side of the printed circuit board, and the $2^{nd}$ seal of the $2^{nd}$ part of the housing on the other side of the printed circuit board. This embodiment is particularly advantageous, for example, to supply many electrical conductors radially, e.g. in a cylindrical vacuum column, such as the column of a particle-optical device.

In a further embodiment of the housing according to the invention, the printed circuit board has a hole so that the enclosed space is one contiguous space.

The parts of the hermetically sealed space are connected to each other by the hole in the printed circuit board, so that one contiguous hermetically sealed space is created.

In yet another embodiment of the housing according to the invention, the printed circuit board is a flexible printed circuit board.

By using a flexible printed circuit board, the possibility is provided of obtaining a seal which does not lie in one plane. This also affords advantages when it is desired to bend (parts of) the printed circuit board inside or outside the hermetically sealed space from the surface of the seal.

The invention is now described with reference to figures in which the same reference figures denote corresponding elements. Here:

Figure 1:
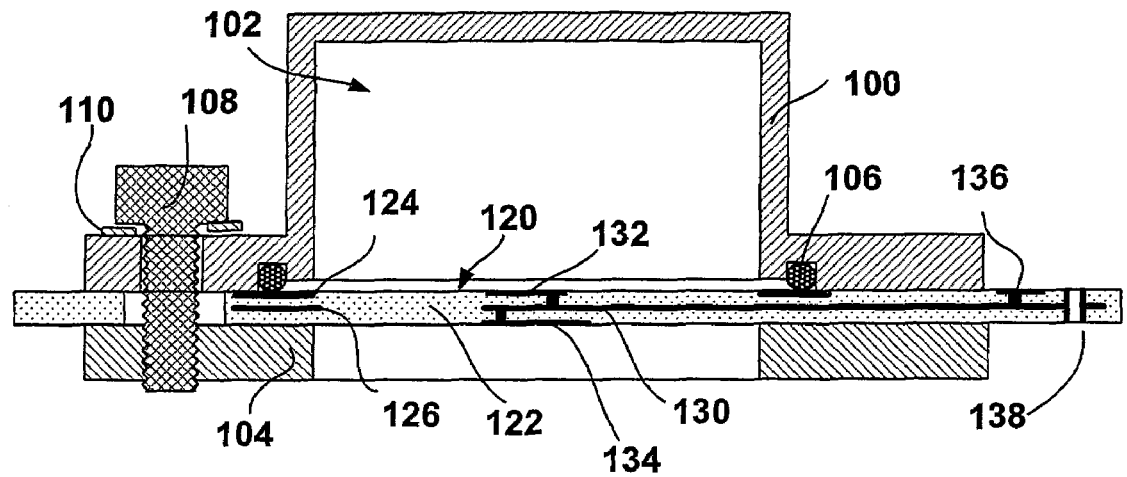
FIG. 1 shows diagrammatically a hermetically sealed space according to the invention.

A printed circuit board 120 seals along a contour on a housing 100 by means of an O-ring 106. This gives rise to a hermetically sealed space 102. In order to press printed circuit board 120 onto the O-ring 106, a compression ring 104 is screwed onto housing 100 with screw 108 and spring ring 110, wherein the printed circuit board 120 is clamped between this compression ring 104 and housing 100.

Printed circuit board 120 consists of a plastic 122, wherein electrically conducting surfaces 124, 126, 128 (Also see FIG. 2) and tracks 130, 132, 134 and 136 are installed, as well as connections (also called vias) between the electrically conducting track 130 and tracks 132, 134 and 136, and a metallised 'through-hole' 138.

Tracks 132, 134 and 136 are connected to each other by means of track 130. This creates an electrical connection between tracks 132, which lies in the hermetically sealed space, and tracks 134 and 136, which lie outside the hermetically sealed space. SMD components (Surface Mounted Devices), such as resistances, relays, IC's, etc., may be soldered on these tracks, for example (not shown). Because such SMD components do not require a 'through-hole', the use of such components will not cause leaks at the points where they are soldered on to the printed circuit board. A wire, a connector, or a so-called 'through-hole' component can be soldered in the metallised drilled hole 138. However, because this 'through-hole' is not a connection between hermetically sealed space and the surrounding area, it will not give rise to leakage either.

For optimum sealing of the O-ring 106 on printed circuit board 120, a metallisation surface 124 is applied under the contour where O-ring 106 touches printed circuit board 120. This metallisation surface 134 reduces surface arches. Moreover, an extra surface 126 is applied at the same height in the printed circuit board as the point where electrical conductor 130 is located. The purpose of this electrically superfluous surface 126 is to keep the thickness of printed circuit board 120 as constant as possible along the entire contour, which results in better sealing.

It should be noted that the metallization coat 124 may lie on the surface of the printed circuit board but that it may also be located underneath a coat of varnish. It should also be noted that it is not necessary for the electrical conductor to project from the contour. For track 130, which is located inside the hermetically sealed space, and track 134 lying outside it, are also connected to each other by means of electrical conductors.

Figure 2:
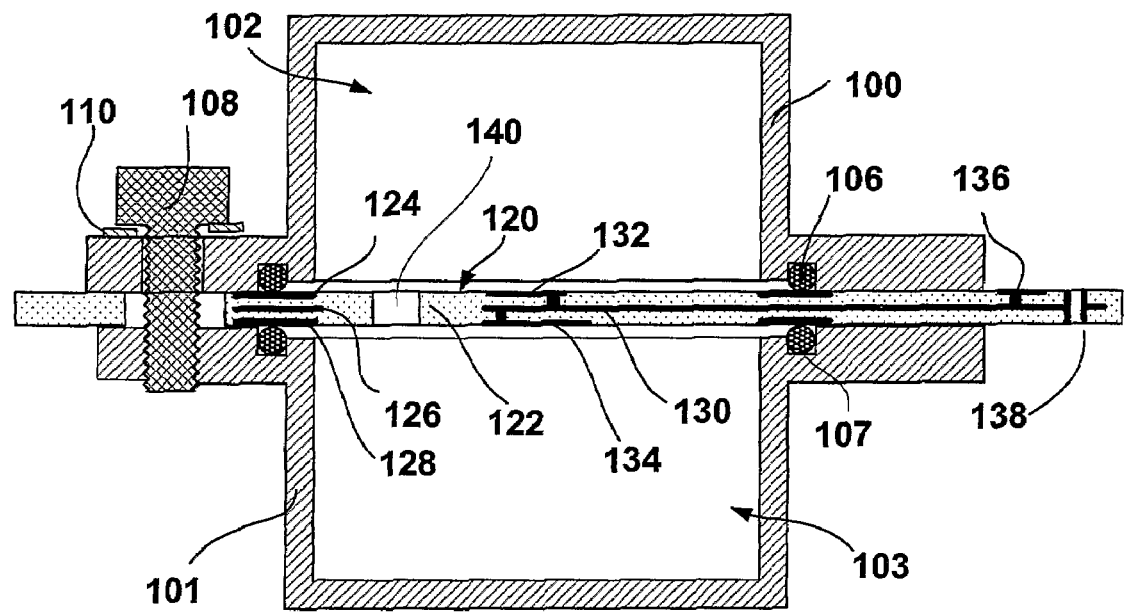
FIG. 2 shows diagrammatically sealed space according to the invention in which the printed circuit board is partially surrounded by the hermetically sealed space.

FIG. 2 shows diagrammatically a hermetically sealed space according to the invention, wherein the printed circuit board is partially surrounded by the hermetically sealed space.

FIG. 2 may conceivably be developed from FIG. 1. On the side of the printed circuit board which is not adjacent to the hermetically sealed space in FIG. 1, a $2^{nd}$ housing section 101 is installed, which second housing section 101 also seals, along a second contour on the second metallization surface 128 on printed circuit board 120. This creates two hermetically sealed partial spaces 102 and 103. Printed circuit board 120 is provided with a hole 140 by means of which partial spaces 102 and 103 form one contiguous hermetically sealed space.

It should be noted that although the figure shows an embodiment in which the $1^{st}$ contour with which housing section 100 seals against the printed circuit board almost coincides with the $2^{nd}$ contour with which housing section 101 seals against the printed circuit board, this is not necessary.

It should further be noted that hole 140, which connects partial spaces 102 and 103, may be a centrally located hole, but that this is not necessary. In order to connect the two partial spaces 102 and 103 together, it is only necessary for hole 140 to be located inside both contours. Moreover, the connection of partial spaces 102 and 103 may be formed by a plurality of holes.

It should also be noted that if it is not necessary to connect partial spaces 102 and 103 together, hole 140 may be dispensed with.

The invention claimed is:

1. A hermetically sealed housing provided with an electrical feed-in, which housing is provided with a feed-in element that is electrically insulated relative to the housing and is hermetically sealed against the housing, wherein:
    the feed-in element comprises a printed circuit board including at least one electrical conductor creating an electrical connection between the hermetically sealed space and an area outside the hermetically sealed space; and
    the sealing between the printed circuit board and the housing is carried out on a flat side of the printed circuit board.

2. The housing according to claim 1, wherein at least part of at least one of the electrical conductors runs parallel with the flat side of the printed circuit board.

3. The housing according to claim 2, wherein the housing seals to an uninterrupted metallization coat on the printed circuit board.

4. The housing according to claim 2, wherein the printed circuit board seals against the housing by means of an elastomer.

5. The housing according to claim 1, wherein the housing seals to an uninterrupted metallization coat on the printed circuit board.

6. The housing according to claim 5, wherein the sealing of the printed circuit board on the housing is the sealing of one metal on another metal.

7. The housing according to claim 1, wherein the printed circuit board seals against the housing by means of an elastomer.

8. The housing according to claim 1, wherein the sealing between the printed circuit board and the housing is detachable.

9. The housing according to claim 1, wherein the printed circuit board is glued on the housing with an elastic adhesive.

10. The housing according to claim 1, wherein the sealing of the printed circuit board on the housing is the sealing of a metal on a plastic.

11. The housing according to claim 1, wherein the housing encloses a space having a low dust content.

12. The housing according to claim 1, wherein the housing encloses a space having reduced pressure.

13. The housing according to claim 1, wherein the housing consists of two parts between which the printed circuit board is clamped.

14. The housing according to claim 13, wherein the housing is provided with a hole so that the enclosed space forms a contiguous space.

15. The housing according to claim 13, wherein the printed circuit board is a flexible printed circuit board.

16. A particle-optical system comprising:
    a housing in accordance with claim 1;
    a focused ion beam system or an electron beam system for irradiating a sample positioned within the housing.

17. A method of providing electrical signals to the interior of a sealed chamber comprising:
    providing a housing having at least two parts;
    positioning a printed circuit board between the two parts;
    hermetically sealing the printed circuit board between the two parts of the housing to produce a sealable interior space, the printed circuit board including at least one electrical connection between the sealable interior space and an area outside the sealable interior space; and
    providing an electrical signal on the printed circuit board outside the sealable interior space to provide an electrical signal into the sealable interior space.

18. The method of claim 17 in which providing a housing having at least two parts includes providing a housing in which one of the parts comprises a member for clamping the printed circuit board against the other part of the housing.

19. The method of claim 17 in which hermetically sealing the printed circuit board between the two parts of the housing to produce a sealable interior space includes sealing a metal layer of the printed circuit board against the housing.

20. The method of claim 17 in which hermetically sealing the printed circuit board between the two parts of the housing to produce a sealable interior space includes applying an elastomer between the printed circuit board and the housing.

* * * * *